United States Patent [19]

Tigelaar

[11] Patent Number: 4,997,781
[45] Date of Patent: Mar. 5, 1991

[54] METHOD OF MAKING PLANARIZED EPROM ARRAY

[75] Inventor: Howard L. Tigelaar, Allen, Tex.

[73] Assignee: Texas Instruments Incorporated, Dallas, Tex.

[21] Appl. No.: 310,999

[22] Filed: Feb. 14, 1989

Related U.S. Application Data

[62] Division of Ser. No. 124,802, Nov. 24, 1987, abandoned.

[51] Int. Cl.⁵ .............................................. H01L 21/70
[52] U.S. Cl. ........................................ 437/43; 437/51; 437/52; 437/191; 437/193; 437/228; 437/233; 437/235
[58] Field of Search ................ 43/42, 43, 233, 235, 43/228, 51, 52; 357/23.5; 437/191, 193

[56] References Cited

U.S. PATENT DOCUMENTS

| | | | |
|---|---|---|---|
| 3,674,551 | 7/1972 | Athanas | 437/228 |
| 4,055,884 | 11/1977 | Jambotkar | 437/27 |
| 4,258,466 | 3/1981 | Kuo et al. | 437/43 |
| 4,295,265 | 10/1981 | Horiuchi et al. | 437/43 |
| 4,505,030 | 3/1985 | Jeuch | 437/228 |
| 4,545,852 | 10/1985 | Barton | 437/228 |
| 4,697,330 | 10/1987 | Paterson et al. | 437/42 |
| 4,713,142 | 12/1987 | Mitchell et al. | 437/228 |
| 4,833,514 | 5/1989 | Esquivel et al. | 437/43 |

FOREIGN PATENT DOCUMENTS

| | | | |
|---|---|---|---|
| 0047684 | 4/1977 | Japan | 357/23.5 |
| 0021871 | 2/1983 | Japan | 357/23.5 |

Primary Examiner—Olik Chaudhuri
Assistant Examiner—T. Thomas
Attorney, Agent, or Firm—Melvin Sharp; James T. Comfort; Richard A. Stoltz

[57] ABSTRACT

An array of floating gate memory cells is formed at a face of a semiconductor layer (10). The array includes a plurality of elongate spaced-apart parallel source/drain regions (12). A thick dielectric layer (14) is formed on the face. A plurality of spaced-apart orifices (16) are formed through the thick dielectric layer (14) to the face, each orifice exposing portions of two adjacent source/drain regions (12) and extending therebetween. A plurality of thin first gate insulators (18) are formed on the face in the orifices (16). Next, conductive floating gate electrodes (20) are formed on the orifices (16) and the first gate insulators (18), with the combined thickness of a floating gate electrode (20) and a first gate insulator (18) approximating the thickness of the thick dielectric layer (14). A planarized surface is thus presented for the deposition of an interlevel insulator (22, 24) and a plurality of control gate electrodes (26).

12 Claims, 1 Drawing Sheet

METHOD OF MAKING PLANARIZED EPROM ARRAY

This is a continuation of application Ser. No. 124,802, filed Nov. 24, 1987, now abandoned.

TECHNICAL FIELD OF THE INVENTION

The present invention relates in general to fabrication processes for floating gate memory arrays, and more particularly relates to a process for fabricating a planarized electrically programmable read-only memory (EPROM) array.

BACKGROUND OF THE INVENTION

Conventional arrays of electrically programmable read-only memory cells (EPROMs) are formed by first implanting a plurality of elongate source/drain regions at a face of a semiconductor substrate. This substrate is then masked, and a field oxide is grown in the unmasked areas. Thereafter, a thin gate oxide is grown between the field oxide areas, and a plurality of floating gates are deposited, patterned and etched to extend over the gate oxide. A second interlevel gate oxide is grown from the floating gates, which are usually polysilicon. Thereafter, a plurality of control electrodes are deposited, patterned and etched such that each of them will extend over a plurality of floating gates in any one row.

The above-described conventional process produces an EPROM array having severe topology. The growth of a field oxide over the source/drain regions depresses them below the original surface of the semiconductor substrate. The source/drain regions are degraded because they experience several temperature cycles during the fabrication of the conventional array. These source/drain regions are therefore less efficient in the generation of hot electrons for injection through the thin gate oxide layer into the floating gate. Programming voltages must therefore be higher, in one instance approximating 14 volts. The severe topology of these conventional arrays increases the incidence of shorting metal and poly filaments and therefore decreases quality control.

From the above, it can be seen that a need has arisen in the industry for a planarized array having substantially flat topology, and further for an EPROM array wherein the source/drain regions comprising its bit lines remain disposed near the original surface of the semiconductor substrate, such that the bit lines can more efficiently generate hot electrons for programming the EPROM cell.

SUMMARY OF THE INVENTION

One aspect of the present invention comprises an array of floating gate memory cells that are formed at a face of a semiconductor layer of a first conductivity type. A plurality of elongate spaced-apart source/drain regions of a second conductivity type that is opposed to the first conductivity type are formed at the face, as by implantation of a dopant species.

Next, a thick dielectric layer is formed on the face, preferably made of an oxide and formed by chemical vapor deposition. A plurality of spaced-apart orifices are formed through this thick dielectric layer to the face, each of the orifices exposing portions of two adjacent source/drain regions and extending therebetween. Then, a plurality of thin first gate insulators are formed on the face in the orifices. Conductive floating gate electrodes are then formed in the orifices on the respective first gate insulators such that the combined thicknesses of a first gate insulator and a respective floating gate electrode approximate the thickness of the thick dielectric layer, thus yielding a substantially planar surface for the deposition of subsequent layers. A second gate insulator, which preferably is a nitride/oxide double layer, is next formed on the floating gate electrodes and the thick dielectric layer. A plurality of conductive control electrodes are then formed on the second gate insulator over the floating gate electrodes.

A principal advantage of the invention is that since the thick dielectric layer is preferably deposited over the semiconductor substrate surface, rather than grown as in the case of the conventional field oxide layers, the source/drain regions stay near the semiconductor layer surface A further principal advantage of the invention is the fabrication of a planarized surface such that poly and metal filaments are reduced and the quality of the produced EPROM cells is increased.

According to another aspect of the invention, the first gate insulator layer is preferably an oxide layer grown on the substrate. This oxide layer may be grown thicker over the source/drain regions than in the remaining, relatively undoped portion of the substrate. Steam may be applied to the semiconductor substrate in a controlled manner to select the degree of coupling between the floating gate electrodes and the source/drain regions.

According to a further aspect of the invention, the thick dielectric layer and the floating gate electrodes are planarized by first depositing a thick conductive layer, such as polycrystalline silicon. One method of planarizing the floating gate electrodes to the thick dielectric layer is to deposit a sufficiently thick amount of polysilicon that a planar surface is presented to the etchant. A back-etch is then performed that will remove all polysilicon from regions outside of the orifices.

Another method of planarizing the floating gate electrodes to the thick dielectric layer is to deposit a conductive layer such as polysilicon in the orifices and over the thick dielectric layer, and then to differentially form a sacrificial layer over the conductive layer such that a planar surface is presented to the etchant. The etchant then back-etches the sacrificial layer and the conductive layer at substantially equal rates until all material down to the surface of the thick dielectric layer is removed.

Further advantages of the invention are that a large overlap is achieved between the source/drain regions and the floating gate electrodes, thus increasing coupling thereof. Also, one mask step that is employed in the conventional process is eliminated.

In the current conventional processes, it is necessary to etch the peripheral array transistors separately. In the process for the invention, the array and periphery transistors are etched in the same step An additional advantage of the invention is that since there are no sharp corners between the first and second polysilicon layers, leakage during word line stress will be reduced and data retention will be enhanced.

BRIEF DESCRIPTION OF THE DRAWINGS

Further aspects of the invention and their advantages will be understood with reference to the following detailed description in conjunction with the drawings in which.

DETAILED DESCRIPTION

Figure 1:
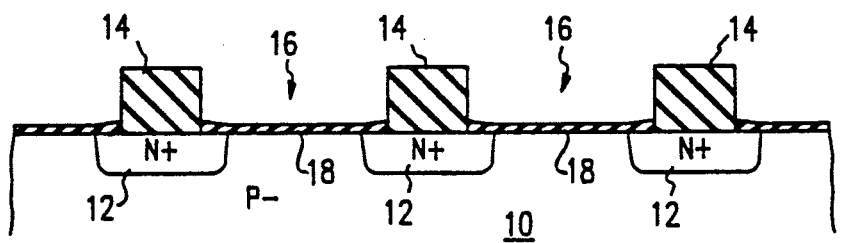
FIG. 1 is a highly enlarged schematic sectional view of a portion of an EPROM array according to the invention, showing initial stages of fabrication.

FIGS. 1-3a are successive schematic sectional views of a small portion of an EPROM array according to the invention, showing successive stages of fabrication. In FIG. 1, a semiconductor substrate or layer 10 is provided. In the illustrated embodiment, layer 10 is doped to be p type. However, the conductivity types of the various parts herein described can easily be reversed.

A plurality of elongate, heavily doped n+ source/drain regions 12 are masked and implanted into semiconductor layer 10. The source/drain implant can be performed with arsenic at a concentration of $5 \times 10^{15}$ ions/cm$^2$ at an implantation energy of approximately 100 KeV. Preferably, the source/drain regions 12 are next annealed at a temperature of 900° C. for about 60 minutes. Referring briefly to the schematic plan view of FIG. 3b, source/drain regions 12, which also act as bit lines of the array, are formed so as to be of uniform width, spaced from each other, and parallel in a column direction.

Returning to FIG. 1, after this anneal a thin oxide layer (not shown) is grown. Since the oxide grows thicker over the N+ areas these areas will be clearly delineated for subsequent patterning steps. A thick dielectric layer 14 is next formed on substrate 10. In a preferred embodiment, layer 14 comprises a layer of oxide as deposited by chemical vapor deposition. This method of forming layer 14 yields the important advantage of not depressing source/drain regions below the original surface of substrate 10. Shallower junctions for better programming of the floating gate electrodes later to be formed are thereby achieved Preferred constituents for the chemical vapor deposition of layer 14 are TEOS (tetraethyl orthosilicate) and oxygen. Oxide layer 14 is preferably deposited on substrate or layer 10 to a depth of approximately 3000 Angstroms.

After the deposition of thick dielectric layer 14, layer 14 is patterned and etched down to the surface of semiconductor layer 10 to form a plurality of floating gate orifices 16. Orifices 16 are patterned so as to span the distance between adjacent source/drain regions 12, and expose substantial portions of them. This further enhances the coupling of the floating gate electrodes to be fabricated later. As shown in FIG. 3b in phantom, orifices 16 are preferably formed to be elongate and in parallel rows.

After orifices 16 have been patterned and etched into thick dielectric layer 14, a dummy dielectric layer (not shown), such as oxide, is grown inside orifices 16 and stripped in order to clean the surface. Next, a first gate oxide layer 18 is grown on the exposed semiconductor substrate 10. This first gate insulator layer 18 is grown to be approximately 100 to 400 Angstroms thick. As shown, first gate oxide layer 18 is thicker over the implanted n+ source/drain regions 12 than over the remainder of substrate 10. This thickening can be controlled by the application of steam if an intentional decoupling between the floating gate electrodes (described below) and the source/drain regions 12 is desired.

Figure 2:
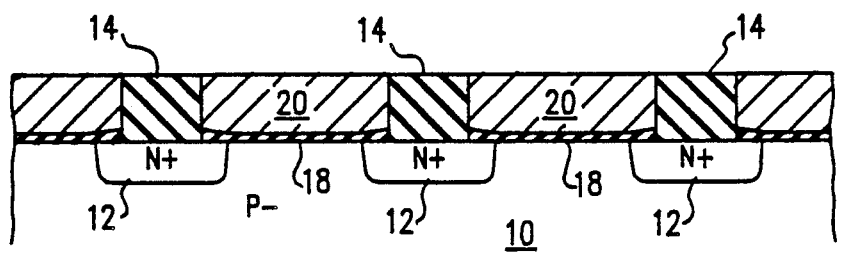
FIG. 2 is a schematic sectional view corresponding to FIG. 1, showing further stages of fabrication.

Turning now to FIG. 2, a thick first polysilicon layer (not shown) is deposited over the entirety of the device surface. According to one embodiment, the polysilicon layer is deposited thickly enough that a planar surface is presented to the etchant in a subsequent etch step. According to another embodiment of the invention, the upper surface of this first poly layer is augmented with a differential deposition of an organic sacrificial layer, such that the sacrificial layer and the first poly layer in combination present a planar surface to the etchant.

Next, an etch-back step is used to etch the first polysilicon layer back to form isolated floating gate electrodes 20. This planarized etch step is performed until the upper surface of the floating gate electrodes 20 is substantially coplanar with the upper surface of thick dielectric layer 14, thereby presenting a planarized surface for the deposition of further layers.

Figure 3A:
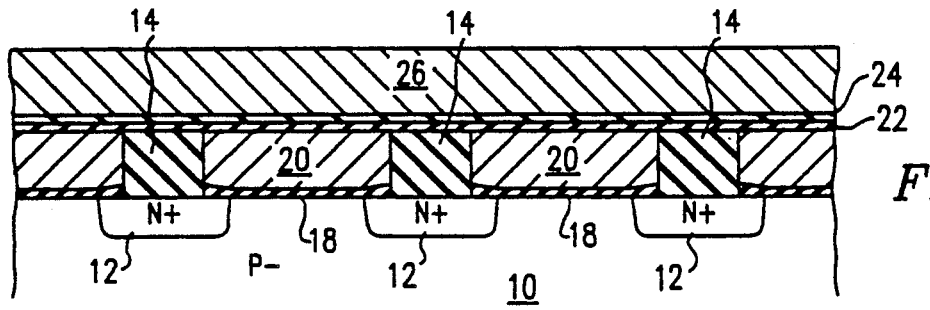
FIG. 3a is a schematic sectional view corresponding to FIGS. 1 and 2, showing final stages of fabrication of an array according to the invention.
Figure 3B:
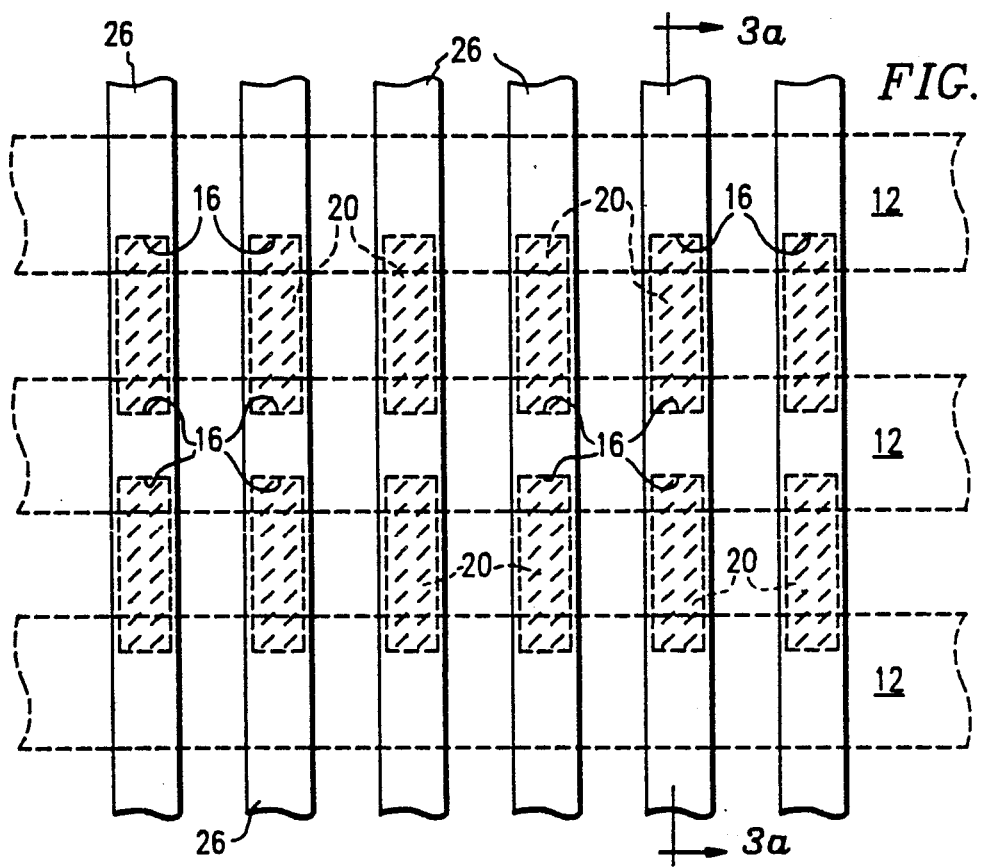
FIG. 3b is a planar view of a small portion of an EPROM array according to the invention, the sectional view in FIG. 3a taken substantially along line 3a-3a of FIG. 3b.

Referring next to FIG. 3a, an interlevel dielectric layer is next deposited over the upper planar surface of thick dielectric layer 14 and floating gate electrodes 20. In a preferred embodiment, this interlevel dielectric layer comprises a thin oxide layer 22 followed by a nitride layer 24. Each of these are deposited to be approximately 250 Angstroms thick. Nitride and oxide layers 22 and 24 are equivalent to approximately 350 Angstroms of oxide alone, and provide a better gate dielectric. Oxide layer 22 can be either grown or deposited.

Next, the interlevel oxide and nitride layers 22 and 24 are patterned and etched off of the periphery (not shown). A second gate oxide (not shown) is grown in a periphery for the peripheral transistors. Nitride layer 24 provides an advantage at this point because when the second gate oxide is grown, the nitride layer 24 passivates the structures below it. The second gate oxide (not shown) is grown to approximately 300 Angstroms.

Next, a second conductive layer (not shown), which preferably again comprises polysilicon, is deposited over nitride layer 24. This second polysilicon layer is patterned and etched to form a plurality of elongate parallel control gate electrodes 26. As shown in FIG. 3b, control gate electrodes 26 are formed in a row direction to be disposed over respective rows of floating gate electrodes 20. Thus, each control gate electrode 26 acts as a word line for a respective row of EPROM cells. Simultaneously with this etch, a plurality of peripheral transistor gates (not shown) are also formed from the second poly layer.

In summary, a planarized EPROM array and a process for producing the same has been described. This array provides significant advantages over prior art structures in that the formation of polysilicon and metal filaments is reduced or eliminated, and shallower source/drain regions promoting improved programming of the floating gate electrodes is effected. The planar topology of this array in general increases the quality of the circuits produced. One mask step is eliminated over conventional process flows, and a large overlap can be achieved between the source/drain regions and the floating gate electrodes, thus improving coupling and performance. Leakage between corners of the floating electrodes and the control gate electrodes is reduced because the control electrodes are disposed in a planar relationship above the floating gate electrodes.

While preferred embodiments of the present invention and their advantages have been described above, the invention is not limited thereto but only by the spirit and scope of the appended claims.

What is claimed is:

1. A process for fabricating an array of floating gate memory cells at a face of a semiconductor layer of a first conductivity type, comprising the steps of:

forming a plurality of elongated spaced-apart parallel source/drain regions of a second conductivity type opposite the first conductivity type at the face;

depositing a thick dielectric layer on the face;

forming a plurality of spaced-apart orifices through the thick dielectric layer to the face, each orifice exposing portions of two adjacent source/drain regions and extending across an exposed surface therebetween;

forming a plurality of thin first gate insulators on the face in the orifices;

forming a plurality of conductive floating gate electrodes in the orifices on respective first gate insulators, the combined thicknesses of a first gate insulator and a respective floating gate electrode approximating the thickness of the thick dielectric layer;

forming a second gate insulator on the floating gate electrodes and the thick dielectric layer; and forming a plurality of conductive control electrodes on the second gate insulator over the floating gate electrodes.

2. The process of claim 1, wherein said step of forming the second gate insulator comprises the further steps of:

forming a thin oxide layer on the floating gate electrodes and the first dielectric layer; and forming a thin nitride layer on the thin oxide layer.

3. The process of claim 2, and further including the steps of:

removing the thin oxide and nitride layers from a peripheral area of the array;

forming a peripheral gate oxide for transistors in the peripheral area; and using the nitride layer to passivate the structures therebeneath from said step of forming the peripheral gate oxide.

4. The process of claim 1, and further including the step of forming the floating gate electrodes from polycrystalline silicon.

5. The process of claim 1, and further comprising the step of annealing the source/drain regions prior to said step of depositing the thick dielectric layer.

6. The process of claim 1, wherein said step of forming the first gate insulator comprises growing a thin layer of oxide on the face inside each orifice.

7. The process of claim 6, and further including the step of forming the first gate insulator in each orifice to be thicker over the source/drain regions than over the exposed surface therebetween.

8. The process of claim 1, and further comprising the step of depositing the thick dielectric layer on the face by chemical vapor deposition such that the source/drain regions remain near the surface of the semiconductor layer.

9. The process of claim 1, wherein said step of forming the floating gate electrodes comprises the further steps of:

depositing a conductive layer in the orifices and over the thick dielectric layer; and back-etching the conductive layer such that the conductive layer is removed from all areas except inside the orifices.

10. The process of claim 9, wherein said step of forming the floating gate electrodes comprises the further step of depositing a conductive layer in the orifices and over the thick dielectric layer to a sufficient thickness that the upper surface thereof is substantially planar.

11. The process of claim 9, wherein said step of forming the floating gate electrodes includes the further steps of:

after depositing the conductive layer, differentially depositing a sacrificial layer such that the upper surface thereof will be planar; and back-etching the sacrificial layer and the conductive layer at substantially the same rate such that all of the conductive layer outside the orifices will be removed down to the surface of the thick dielectric layer.

12. A process for fabricating an array of electrically programmable read-only memory cells arranged in rows and in columns at an angle to the rows at a face of a semiconductor layer of a first conductivity type, comprising:

implanting a plurality of elongate spaced parallel source/drain regions of a second conductivity type opposite the first conductivity type into the face, the source/drain regions oriented in a column direction;

depositing a thick dielectric layer on the face;

selectively etching a plurality of spaced-apart floating gate orifices through the thick dielectric layer to the face, the floating gate orifices aligned in the rows and columns, each floating gate orifice exposing portions of two source/drain regions;

forming a thin gate dielectric layer on the face in each floating gate orifice;

depositing a thick first conductor layer over the dielectric layers in sufficient thickness such that the first conductor layer has a substantially planar upper surface;

etching the first conductor layer to remove all portions thereof outside the orifices such that an isolated floating gate is formed in each orifice having an upper surface substantially coplanar with the upper surface of the thick dielectric layer;

forming a second thin dielectric layer over the thick dielectric layer and over the floating gates; and forming a plurality of elongate parallel conductive control electrodes on the second thin dielectric layer, each control electrode formed over a row of floating gates.

* * * * *